United States Patent
Stewart et al.

(10) Patent No.: US 7,369,587 B2
(45) Date of Patent: May 6, 2008

(54) TEMPERATURE CONTROL FOR COARSE WAVELENGTH DIVISION MULTIPLEXING SYSTEMS

(76) Inventors: James Stewart, 756 Acacia Dr., Burlingame, CA (US) 94010; Anthony Ho, 355 N. Wolfe Rd. #331, Sunnyvale, CA (US) 94085

( * ) Notice: Subject to any disclaimer, the term of this patent is extended or adjusted under 35 U.S.C. 154(b) by 89 days.

(21) Appl. No.: 11/020,052

(22) Filed: Dec. 21, 2004

(65) Prior Publication Data

US 2005/0185684 A1      Aug. 25, 2005

Related U.S. Application Data

(60) Provisional application No. 60/546,783, filed on Feb. 21, 2004.

(51) Int. Cl.
*H01S 3/13* (2006.01)

(52) U.S. Cl. .............................. 372/29.02; 372/38.02; 372/29.015

(58) Field of Classification Search .................. 372/32
See application file for complete search history.

(56) References Cited

U.S. PATENT DOCUMENTS

| 5,019,769 | A  | * | 5/1991  | Levinson ...................... 372/31 |
| 2002/0196491 | A1 | * | 12/2002 | Deng et al. .................. 359/124 |
| 2003/0152118 | A1 | * | 8/2003  | Chieng et al. ................. 372/34 |
| 2004/0022543 | A1 | * | 2/2004  | Hosking et al. ............ 398/135 |
| 2004/0161001 | A1 |   | 8/2004  | Stewart et al. |

OTHER PUBLICATIONS

U.S. Appl. No. 60/546,782, filed Feb. 21, 2004, entitled "Power Optimization for Operation of Laser with Thermoelectric Cooler."

* cited by examiner

*Primary Examiner*—Dung (Michael) T. Nguyen

(57) ABSTRACT

Optoelectronic devices and methods are used to maintain a CWDM transmitter operating within design parameters over an extended ambient temperature range. In order to avoid excessive wavelength drift with temperature shifts, lasers in the CWDM transmitters are heated or cooled to a selected temperature, for example by using a thermoelectric cooler. By heating and cooling the lasers, any wavelength drift that an ambient temperature variation might inflict on the laser is minimized to the range hotter or colder than the selected temperature. As the temperature range of the laser increases above the selected temperature, the AC swing driving the laser is increased to maintain a sufficient extinction ratio for acceptable transmitter performance.

9 Claims, 5 Drawing Sheets

TEMPERATURE CONTROL FOR COARSE WAVELENGTH DIVISION MULTIPLEXING SYSTEMS

CROSS-REFERENCE TO RELATED APPLICATIONS

This application claims the benefit of U.S. Provisional Application No. 60/546,783, filed Feb. 21, 2004, which is incorporated by reference herein in its entirety.

BACKGROUND OF THE INVENTION

1. The Field of the Invention

The present invention relates generally to optoelectronic components. More particularly, the present invention relates to systems and methods for maintaining a CWDM transmitter emitting within a target wavelength channel over an extended temperature range.

2. The Relevant Technology

Computer and data communications networks continue to develop and expand due to declining costs, improved performance of computer and networking a equipment, the remarkable growth of the internet, and the resulting increased demand for communication bandwidth. Such increased demand is occurring both within and between metropolitan areas as well as within communications networks. Moreover, as organizations have recognized the economic benefits of using communications networks, network applications such as electronic mail, voice and data transfer, host access, and shared and distributed databases are increasingly used as a means to increase user productivity. This increased demand, together with the growing number of distributed computing resources, has resulted in a rapid expansion of the number of fiber optic systems required.

Through fiber optics, digital data in the form of light signals is formed by lasers or light emitting diodes and then propagated through a fiber optic cable. Such light signals allow for high data transmission rates and high bandwidth capabilities. The light signals are then received at a photodiode which converts the light signal back into an electrical signal. Current optical designs typically include both the laser and the photodiode within a single transceiver module that can be connected to a host device, such as a host computer, switching hub, network router, switch box, computer I/O and the like, via a compatible connection port at one end and to a fiber optic cable at the other. Each transceiver module typically contains, in addition to the laser and photodiode, all the other optical and electrical components necessary to change electrical signals to optical signals via the laser and optical signals back into electrical signals received at the photodiode.

Another advantage in using light as a transmission medium is that multiple wavelength components of light can be transmitted through a single communication path such as an optical fiber. This process is commonly referred to as wavelength division multiplexing (WDM), where the bandwidth of the communication medium is increased by the number of independent wavelength channels used. Several wavelengths channels can be transmitted using coarse wavelength-division multiplexing (CWDM) applications to achieve higher channel density and total channel number in a single communication line.

FIG. 1 illustrates eight wavelength channels that are typically used in CWDM systems. As illustrated, CWDM typically implements a channel spacing of 20 nanometers. Thus, CWDM allows a modest number of channels, typically eight or less, to be stacked around the 1550 nm region of the fiber. FIG. 1 illustrates how CWDM transmission may occur at one of eight wavelengths: typically 1470 nm, 1490 nm, 1510 nm, 1530 nm, 1550 nm, 1570 nm, 1590 nm, and 1610 nm.

In order to save cost and reduce power consumption, CWDM transmitters conventionally use uncooled lasers with a relaxed, room temperature tolerance of ±3 nm. The wide spacing accommodates the uncooled laser wavelength drifts that occur as the ambient temperature varies within a relatively small acceptable range.

FIG. 2 illustrates in greater detail three adjacent channels in a CWDM system. Each channel uses a filter that has a pass-band approximately 11 nm wide. Operation outside the allowable allowed pass-band results in high attenuation of the transmitted signal, and in extreme cases, potential crosstalk with the adjacent channel. It is not necessary that the emitted light from a transmitter occupy the entire channel, only that it stays within it. Thus, it can be seen that the spectrum of the light transmitted from a transmitter may occupy the wavelength range illustrated by wavelength range 12 in the center of the passband. It is also acceptable if the transmitted light is on one side of the wavelength channel, for example wavelength range 14. A CWDM system does not operate properly, however, if a transmitter emits light in a wavelength range that is outside the designated passband or overlaps with an adjacent passband, by way of example wavelength range 16.

There are several factors determining the wavelength of a signal produced by traditional laser sources. These factors include, for example, current density, temperature of the light emitter, and the specific inherent characteristics of the light emitter. With reference to FIG. 3, a chart depicting wavelength ($\lambda$) shift over a varying temperature range is depicted. The range of wavelengths is depicted along the y axis, having no particular wavelengths indicated and the range of temperatures is depicted along the x axis, from −40° C. to 85° C. A line 20 is shown to depict the characteristic wavelength shift as temperature increases. It is generally accepted that a wavelength drift of 0.1 nm per degree Celsius shift if a good approximation of the shift for Distributed Feedback ("DFB") laser sources that are commonly used in CWDM applications. It can therefore be seen how the wavelength of the emitted light shifts approximately +12.5 nm over the 125 degree temperature change. This is illustrated by the slope of plot 20, with the low point 22 of the slope at −40° C. being 12.5 nm below the high point 24 at 85° C.

In order to control the effects of temperature-caused wavelength drifting, CWDM transceivers are typically cooled by devices external to the transceiver, such as fans and their placement in controlled temperature rooms. The controlled environment maintains the transceiver component within a reasonable temperature range so that the laser emits at a wavelength range within the designated wavelength channel.

Using CWDM transceivers only in controlled environments can be very restrictive and expensive, however. As a result, there has arisen an interest to operate CWDM transceivers in less expensive or more convenient locations. For example, it would represent and advance in CWDM technology if a CWDM transceiver could be operated in the field, for example at a data relay station in a remote location. In fact, the desired operating conditions for CWDM transceivers are currently as large as from −40° C. to 85° C.

As a result, what are needed are devices and methods to enable CWDM transceivers to be operated in an environment having large temperature variations without experiencing excessive wavelength drift. In particular, it would represent an advance in the art to enable the operation of CWDM transceivers without the use of fans or their placement in controlled temperature rooms.

BRIEF SUMMARY OF THE INVENTION

The present invention relates to methods and systems used to maintain a CWDM transmitter operating within design parameters over an extended ambient temperature range. More particularly, in order to avoid excessive wavelength drift with ambient temperature shifts, lasers in CWDM transmitters are heated and cooled to a selected set point temperature. The set point temperature is preferably one at which a laser temperature can be locked over the largest ambient temperature range. By heating and cooling the lasers, any wavelength drift that an ambient temperature variation might inflict on the laser is minimized to a tolerable range. As the temperature of the laser increases or decreases from the set point temperature, the AC swing driving the laser can be adjusted to maintain a sufficient extinction ratio for acceptable transmitter performance.

Accordingly, a first example embodiment of the invention is a method of maintaining the wavelength of light emitted by a laser diode within a desired tolerance range. The method generally includes: providing a laser diode that is operable from at least a first selected temperature to a second selected temperature, wherein the wavelength of light emitted by the laser diode over the temperature range from the first temperature to the second temperature shifts by an amount greater than is desired; and heating or cooling the laser diode, as necessary, so that the laser diode does not fall below a third temperature, the third temperature being between the first temperature and a the second temperature, or rise above a fourth temperature, the fourth temperature being between the third temperature and the second temperature, wherein the wavelength shift of the light emitted by the laser diode over the temperature range from the third temperature to the fourth temperature shifts by an amount that falls within the desired tolerance range. In one variation on this embodiment, upon the temperature of the laser diode falling below the third temperature or rising above the fourth temperature, the AC swing to the laser diode is adjusted to minimize the extinction ratio variation from the set-point.

Another example embodiment of the invention is also a method of operating an optoelectronic assembly for use in a CWDM system. This method generally includes: heating a laser diode in an optoelectronic assembly to a set point temperature that is above the typical ambient temperature of the optoelectronic assembly; operating the laser diode to emit light; upon identifying that the temperature of the laser diode is above or below the set point temperature, heating or cooling the laser diode to within a selected range of the set point; and upon identifying that the temperature of the laser diode is above or below the set point temperature and there is insufficient power available to further heat or cool the laser diode, adjusting the AC swing driving the laser diode to minimize the extinction ratio variation.

Yet another example embodiment of the invention is an optoelectronic device. The optoelectronic device generally includes: an optoelectronic assembly that includes a laser diode for emitting light; a laser driver for controlling the operation of the laser diode; a temperature controller coupled to the laser diode for controlling the temperature of the laser diode; at least one temperature sensor for detecting a temperature associated with the laser diode; memory configured to store a look up chart for controlling the AC swing of the laser diode based upon the detected laser diode temperature; and one or more control apparatuses for generating: a command signal to the temperature controller for controlling the operation of the temperature controller such that the temperature controller maintains the laser diode temperature within a range near a set point temperature; and a command signal to the laser driver for controlling the AC swing of the laser diode.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The present invention relates to methods and systems used to maintain a CWDM transmitter operating within design parameters over an extended ambient temperature range. In order to avoid excessive wavelength drift with ambient temperature shifts, lasers in the CWDM transmitters are heated and cooled to a selected range around a set point temperature. By heating and cooling the transmitter, any wavelength drift that an ambient temperature variation might inflict on a laser in the transmitter is minimized to a tolerable range.

Reference will now be made to the drawings to describe various aspects of exemplary embodiments of the invention. It is to be understood that the drawings are diagrammatic and schematic representations of such exemplary embodiments, and are not limiting of the present invention, nor are they necessarily drawn to scale.

In the following description, numerous specific details are set forth in order to provide a thorough understanding of the present invention. It will be obvious, however, to one skilled in the art that the present invention may be practiced without these specific details. In other instances, well-known aspects of optoelectronic systems and devices have not been described in particular detail in order to avoid unnecessarily obscuring the present invention.

Figure 4:
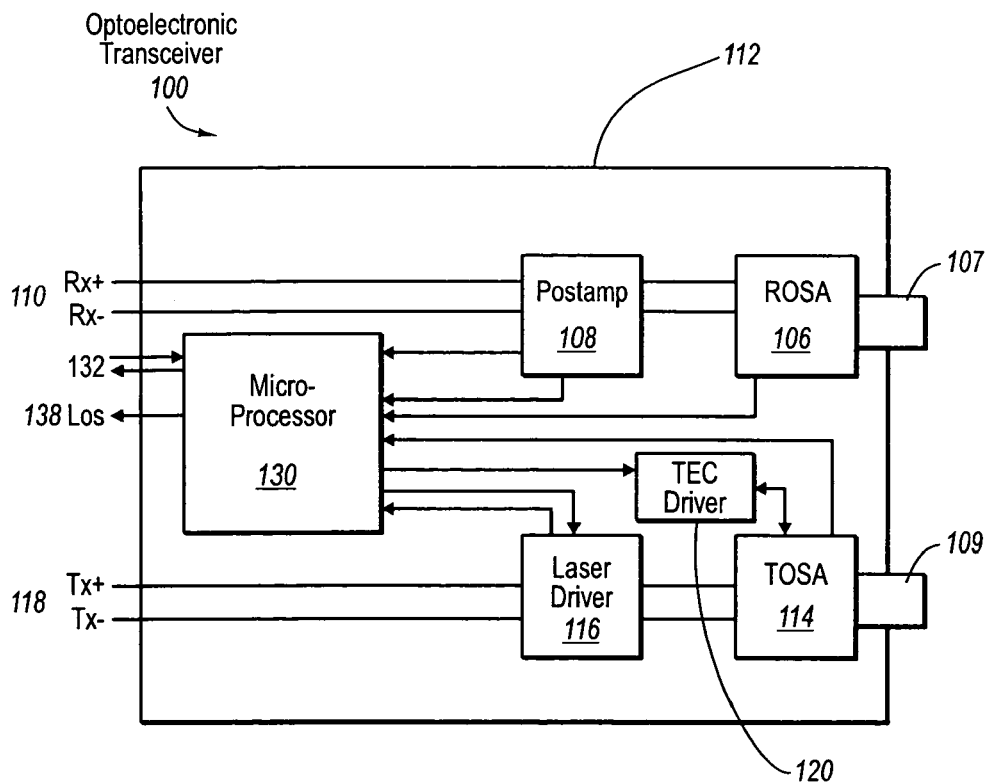
FIG. 4 illustrates an optoelectronic transceiver according to one embodiment of the invention.

Referring now to FIG. 4, FIG. 4 shows a schematic representation of one embodiment of an optoelectronic transceiver 100 that can be used in a CWDM system according to the invention. It will be understood by those skilled in the art, in view of the disclosure herein, that aspects of the invention can be practiced outside of the context of transceiver 100 and the accompanying discussion herein. As illustrated in FIG. 4, transceiver 100 includes a Receiver Optical Subassembly (ROSA) 106, which contains a mechanical fiber receptacle 107 and coupling optics, as well as a photo diode and a pre-amplifier (preamp) circuit. ROSA 106 is in turn connected to a post amplifier (postamp) integrated circuit 108, the function of which is to take relatively small signals from ROSA 106 and amplify and limit them to create a uniform amplitude digital electronic output, which is connected to outside circuitry via RX+ and RX− pins 110. The postamp circuit 108 provides a digital output signal known as Signal Detect or Loss of Signal indicating the presence or absence of suitably strong optical input.

Transceiver 100 also includes a Transmitter Optical Subassembly (TOSA) 114 and a laser driver integrated circuit 116, with signal inputs obtained from the TX+ and TX− pins 118. TOSA 114 contains a mechanical fiber receptacle 109 and coupling optics, as well as a thermo-electric cooler (TEC) and a laser diode or LED. The laser driver circuit 116 provides AC drive and DC bias current to the laser. The signal inputs for the driver are obtained from I/O pins (not shown) of transceiver 100. In other embodiments, the TEC is external to the TOSA 114. In yet other embodiments, the TEC is integrated within a laser transistor-outline (TO) package.

Because of the large number of designs that could potentially be created to enable a transceiver to interface with a host device and an optical fiber, international and industry standards have been adopted that define the physical size and shape of optical transceiver modules to ensure compatibility between different manufacturers. For example, in 1998 a group of optical component manufacturers developed a set of standards for optical transceiver modules called the Small Form-factor Pluggable Transceiver MultiSource Agreement (SFP Transceiver MSA). In addition to the details of the electrical interface, this standard defines the physical size and shape for the SFP transceiver modules, the amount of power the transceiver module can use, and the corresponding module cage that is mounted on a printed circuit board at the host and receives the transceiver modules, so as to insure interoperability between different manufacturers' products.

As data rates increase, and transceiver packages get smaller, the heat generated by the transceivers typically increases as well. The use of heat dissipation mechanisms, however, increases the complexity and cost of the transceiver assembly, reduces the space that would otherwise be available for the functional optical and electrical components of the assembly, and increases the amount of power required to operate the transceiver. For this reason, conventional CWDM systems are uncooled and rely on wide channel spacings and/or moderately controlled environments.

One solution for cooling a transceiver is to use a thermo-electric cooler (TEC). A TEC is a device operable to maintain the temperature of a component at a predefined point. If the component gets too hot, power flows in one direction in the TEC to produce cooling. If the component gets too cold, the power is routed in the other direction and the TEC becomes a heater. Unfortunately, TECs require much more power in cooling mode than in heating mode. As the temperature of the module increases, the amount of power consumed in keeping the module at a constant temperature increases exponentially. Because transceiver standards tightly control the amount of power that can be supplied to a transceiver, it is not conventionally feasible to provide the amount of cooling necessary to use a TEC to maintain a transceiver at a narrow range of desired temperatures over a wide ambient temperature range.

TECs are successfully used in Dense Wavelength-Division Multiplexing (DWDM) systems wherein the TECs fine tune a laser's operations in combination with other temperature control systems, mainly controlled temperature rooms. Thus, the TEC is not responsible for significant temperature adjustments.

According to the invention, the use of TECs or other temperature control devices in CWDM transceivers is made possible by limiting the maximum amount of heating or cooling. This limits the power usage required for the transceiver while enabling the use of a CWDM module over a wide ambient temperature range. Accordingly, in this embodiment optoelectronic transceiver 100 includes a temperature controller (e.g., a thermal-electric cooler (TEC)) disposed in or near TOSA 114 for controlling the temperature of the laser diode therein. The optoelectronic transceiver 100 also includes a TEC driver 120 and additional circuitry that is not shown for controlling the temperature of TOSA 114.

Also shown in FIG. 4 is a microprocessor 130, which may include one, two, or more chips, configured for controlling the operations of the transceiver 100. Suitable microprocessors include the PIC16F873A, PIC16F8730 and PIC16F871 8-bit CMOS FLASH microcontrollers manufactured by Microchip Technology, Inc. Microprocessor 130 is coupled to provide control signals to post-amplifier 108, laser driver 116, and other components and receive feedback signals from ROSA 106 and TOSA 114. For example, microprocessor 130 provides signals (e.g., bias and amplitude control signals) to control the DC bias current level and AC modulation level of laser driver circuit 116 (which thereby controls the extinction ratio (ER) of the optical output signal), while post-amplifier circuit 108 provides a Signal Detect output to microprocessor 130 to indicate the presence or absence of a suitably strong optical input.

Importantly, the bias current level and the AC modulation level both affect the optical output wavelength of transceiver 100. Persons skilled in the art recognize that increases in the bias current and, to a lesser extent, increases in the AC modulation can increase the temperature of the active region of a laser chip. More specifically, as the bias current and AC modulation increase, so does the power dissipation of the laser chip. And as the power dissipated in the laser chip increases, so does the temperature of the laser chip, which has a fixed thermal resistance. This is true even though the temperature at the base of the laser chip is typically controlled by TEC 120.

Temperature and/or other physical conditions of various components of transceiver 100 may be acquired using sensors that are coupled to microprocessor 130. In some embodiments, conditions of the optical links may also be acquired using the sensors.

In addition to, and sometimes in conjunction with these control functions, there are a number of other tasks that may be handled by microprocessor 130. These tasks include, but are not necessarily limited to, the following: setup functions which generally relate to the required adjustments made on a part to part basis in the factory to allow for variations in component characteristics such as laser diode threshold current and slope efficiency; identification functions that control the storage of an identity code, sub component revisions, factory test data, and the like within a general purpose memory (e.g., an EEPROM); eye safety and general fault detection to identify abnormal and potentially unsafe operating parameters and to report these to the host device and/or perform laser shutdown, as appropriate; receiver input optical power measurement; laser diode drive current functions to set the output optical power level of the laser diode; and laser diode temperature monitoring and control. In addition, microprocessor 130 is responsible for providing control signals to the temperature controller to maintain the temperature of TOSA 114 and case 112 of transceiver 100 at a desired set point.

With continued reference to FIG. 4, transceiver 100 has an interface 132 for communicating with a host device, for example a link card to which a transceiver is attached and/or a host system computer to which a transceiver provides an optical connection. Host systems may be computer systems, network attached storage (NAS) devices, storage area network (SAN) devices, optoelectronic routers, as well as other types of host systems and devices.

In some embodiments, optoelectronic transceiver 100 includes an integrated circuit controller that may perform some of the functions listed above. For example, an integrated circuit controller performs the tasks of identification and eye safety and general fault detection, while the microprocessor provides control signals to the temperature controller and also may perform other tasks.

All the components of transceiver 100 may be located in a protective housing 112, except for connectors that may protrude from the housing. In addition, transceiver 100 contains at a minimum, transmit and receiver circuit paths as well as one or more power connections and one or more ground connections.

Figure 5:
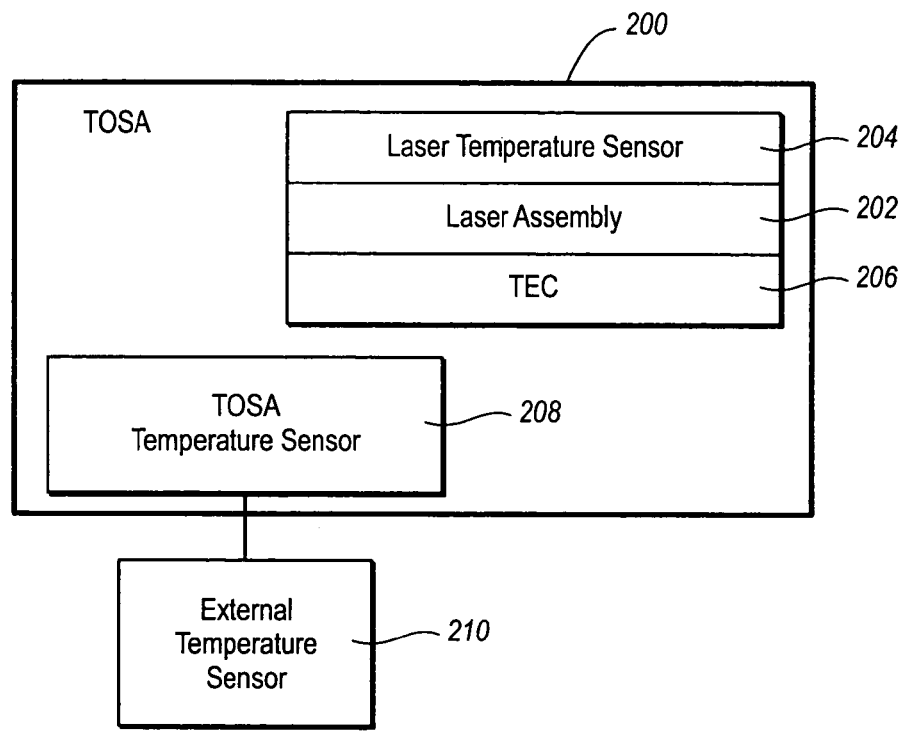
FIG. 5 illustrates a transmitter optical subassembly according to one embodiment of the invention.

Referring now to FIG. 5, limited features of a TOSA 200 are depicted in block form to further illustrate the invention. In one embodiment, TOSA 114 may be substantially the same as TOSA 200. TOSA 200 includes a laser assembly 202 (e.g., a laser transistor outline package), which in turn includes a light emitter (e.g., an edge emitting laser diode such as a distributed feedback laser (DFB)) that is activated when a positive bias current, laser bias, is applied across its p-n junction. Also shown in FIG. 5 are a laser temperature sensor 204 and a thermoelectric cooler (TEC) 206, each coupled to the laser assembly 202. In other embodiments, the laser temperature sensor 204 and/or the TEC 206 are integrated within the laser assembly 202. In yet other embodiments, the TEC 206 is external to the TOSA 106. In still other embodiments the laser temperature sensor may be located apart from laser subassembly 202, for example positioned elsewhere in TOSA 200 (e.g., TOSA temperature sensor 208) or external to the TOSA (e.g., external temperature sensor 210).

In some embodiments, the laser temperature sensor 204 is a thermistor. Any other device suitable for measuring the temperature of the laser diode may also be used. The laser temperature sensor 204 generates a signal that varies as a function of the temperature of the laser diode. As described above, and as is well known to those skilled in the art, the wavelength of optical signals generated by a laser diode varies as a function of the temperature of the laser diode. Accordingly, a device measuring an operating condition of the laser diode that varies as a function of the temperature of the laser diode is used instead of the laser temperature sensor 204. For example, since the wavelength of the emitted light varies with temperature, measurements of the wavelength of the emitted light can be used to determine temperature shifts and thereby coordinate changes in TEC operation.

Although a laser temperature sensor 204 is preferably placed in the proximity of a laser diode, the temperature reading from the laser temperature sensor 204 generally differs from the actual temperature of the laser diode because the laser temperature sensor 204 is physically separated from the laser diode. As a consequence, the temperature reading from the laser temperature sensor 204 and its signal vary as a function of the outside temperature. By receiving the ambient temperature signal, for example from TOSA temperature sensor 208 and/or external temperature sensor 210, the microprocessor 130 (or similar device) is able to compensate for the effect of the ambient temperature on the temperature reading from the laser temperature sensor.

Figure 3:
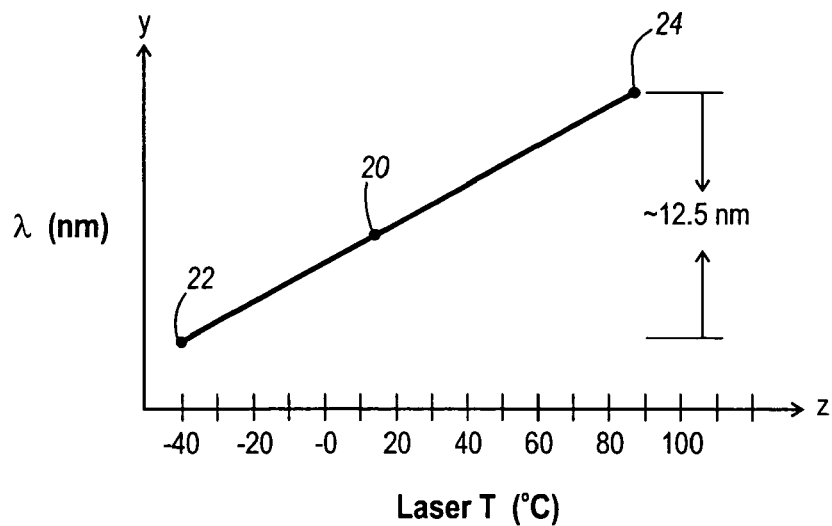
FIG. 3 illustrates a plot of the wavelength of light emitted by a laser diode over a range of laser diode temperatures.
Figure 6:
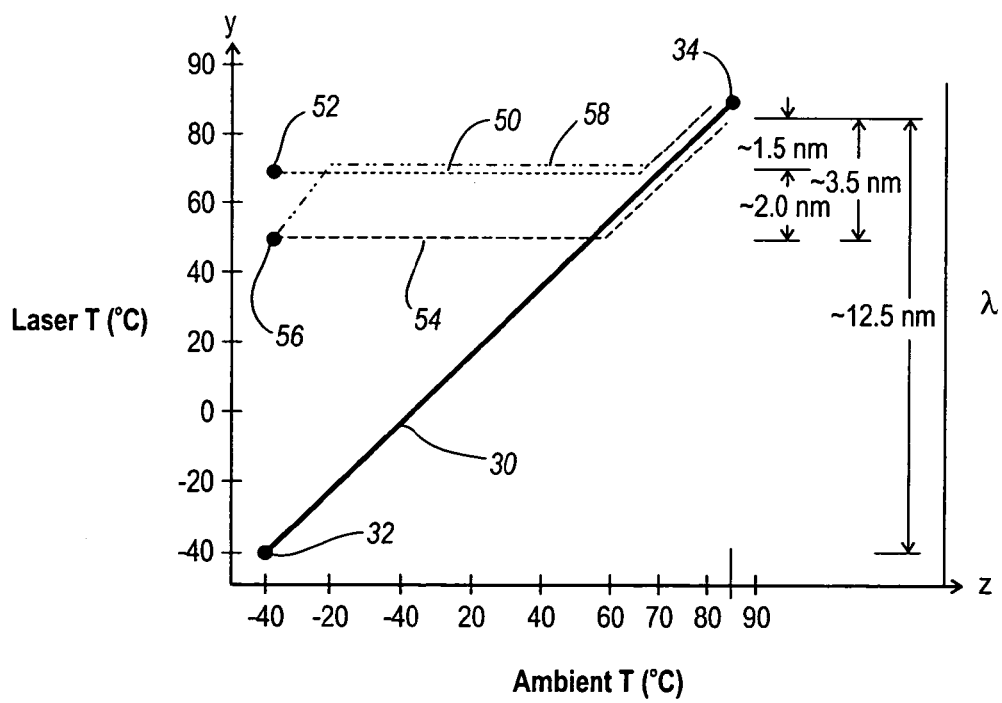
FIG. 6 illustrates a plot of the wavelength of light emitted by a laser diode over a range of laser diode temperatures and ambient temperatures according to embodiments of the invention.

Referring now to FIG. 6, depicted is a plot similar to FIG. 3. As previously mentioned, plot 20 in FIG. 3 depicts a steady wavelength shift over the entire temperature range of –40° C. to 85° C. Plot 30 in FIG. 6 roughly corresponds to plot 20 from FIG. 3, except that plot 30 also reflects a laser having a temperature that varies directly from point 32 to point 34 with ambient temperature changes. Of course, one skilled in the art will recognize that the actual laser temperature may vary slightly from the ambient temperature due to heat generated from operating a transmitter or other factors.

FIG. 6 also illustrates how heating or cooling a laser temperature to a set point can reduce the wavelength shift experienced by the laser. In one embodiment of the invention, TEC 206 is used to provide heating or cooling to the laser as necessary based upon the measurements of laser temperature sensor 204, TOSA temperature sensor 208, and/or external temperature sensor 210.

Plot 54 depicts the wavelength shift of light over the same 125 degree temperature change experienced by the laser as illustrated by plot 30. In this embodiment, the TEC is set to heat the transmitter up to 50° C. No cooling operations are enabled, however. As a result, any wavelength shift with temperature is eliminated below 50° C., as indicated by the lack of slope on the plot 54 to the left of 50° C. ambient temperature. In this embodiment, the TEC or other heat source is operable to heat the laser diode at least 90°. There is still a wavelength shift with ambient temperature above 50° C. since the TEC is not controlling the laser temperature above that point. This is indicated by the sloped line on plot 54 to the right of 50° C. As used herein, therefore, the term "temperature locked" is used to denote how the temperature of the transmitter (and hence the emitting laser) is maintained at 50° C. when the ambient temperature is at or below 50° C. In FIG. 6, the wavelength depicted on plot 54 is temperature locked below 50° C. ambient temperature and drifts by approximately 3.5 nm above 50° C. A wavelength drift of 3.5 nm is generally acceptable in CWDM systems.

In heating-only implementations, such as for example the embodiment shown in plot 54, the TEC can be replaced by a resistive heater. This feature may be preferred in some embodiments since a resistive heater is less costly than a TEC. Heating-only techniques work well in embodiments where the laser can operate at relatively high temperatures. This is because most conventional CWDM distributed feedback lasers have performance and/or reliability issues if operated for extended periods above 50° C.

Of course, the same benefits of locking a transmitter at a selected temperature can be enhanced by enabling cooling operations. A TEC is required for cooling operations with the benefit of a larger locked temperature range with less wavelength variation. In other words, by cooling the laser diode to 50° C. when the ambient temperature exceeds 50° C., wavelength shifting is avoided. In addition, device hardware, such as for example distributed feedback lasers, have fewer performance and/or reliability issues if they are not operated for extended periods above 50° C.

In one embodiment of the invention that is not depicted in FIG. 6, the temperature of a laser diode is locked to 50° C. over an ambient temperature range from −40° C. a temperature higher than 50° C., for example 70° C. Because of the limited power available to the TEC, however, the temperature of the laser diode loses lock when the ambient temperature exceeds 70° C. In this case, there is a relatively small wavelength shift of about 1.5 nm for the temperature range from 70° C. to 85° C.

The same benefits of locking a transmitter to one selected temperature can be maintained by heating a transmitter to other temperatures, for example 70° C. Plot 50 depicts the wavelength shift of light over a 125 degree ambient temperature change when the transmitter temperature is locked to 70° C. In the illustrated embodiment, the TEC is set to heat the transmitter to 70° C. As a result, any wavelength shift with temperature is eliminated below 70° C., as indicated by the lack of slope on the plot 50 to the left of 70° C. ambient temperature. There is still a wavelength shift with ambient temperature above 70° C. since the TEC is not controlling the laser temperature above that point. This is indicated by the sloped line on plot 50 to the right of 70° C. In FIG. 6, the wavelength depicted on plot is locked below 70° C. and drifts by approximately 1.5 nm above 70° C. A wavelength drift of 1.5 nm is generally acceptable in CWDM systems.

As previously discussed, cooling operations of the TEC can be enabled for this embodiment to lock the laser diode temperature at 70° C. even as the ambient temperature exceeds this temperature. The precise amount of cooling that can be obtained is dependent upon the power available to the transceiver.

Plot 58 also depicts the wavelength shift of light over the same 125 degree temperature change experienced by the laser as illustrated by plot 30. In this embodiment, the TEC is set to heat the transmitter up to 70° C. No cooling operations are enabled in the depicted embodiment, although one skilled in the art could add cooling operation in view of the disclosure herein. As a result, any wavelength shift with temperature is eliminated in the range immediately below 70° C. ambient temperature, as indicated by the lack of slope on the plot 58 to the immediate left of 70° C. ambient temperature. There is still a wavelength shift with ambient temperature above 70° C. since the TEC is not controlling the laser temperature above that point. This is indicated by the sloped line on plot 58 to the right of 70° C. In FIG. 6, the wavelength depicted on plot 58 is temperature locked in the range immediately below 70° C. ambient temperature and drifts by approximately 1.5 nm above 70° C.

In addition, in this embodiment the transmitter also loses lock below −20° C. (where the maximum heating is limited due to module power constraints). The lower end temperature at which a particular device may lose lock will vary from device to device. As illustrated by the sloped portion of plot 58 to the left of −20° C. and ending at point 56 at −40° C. ambient temperature, the device loses lock below −20° C. such that at −40° C. ambient temperature the transmitter operates at 50° C. The exact amount the temperature the laser drops due to the loss of temperature lock may vary from device to device. In this embodiment, the wavelength drifts by approximately 2.0 nm below −20° C. As a result, a transmitter operating on plot 58 experiences a net wavelength drift of 3.5 nm over the range of −40° C. to 85° C. As previously noted, a wavelength drift of 3.5 nm is generally acceptable in CWDM systems.

Generally, operating laser diodes above the ambient temperature allows TECs to function more efficiently because TECs are more efficient when heating than cooling. TECs are more efficient when heating than cooling because the thermoelectric effect and resistive heating are working together when the TECs are heating the laser diodes, rather than opposing one another as is the case when the TECs are cooling the laser diodes. Efficiency is of particular importance in pluggable transceiver applications, where the available power, and thus the ability of TECs to function, is limited to specified levels. Running CWDM modules with a TEC in heating mode only is acceptable under current CWDM transceiver standards because the limited current draw does not exceed the maximum allowable.

Figure 7:
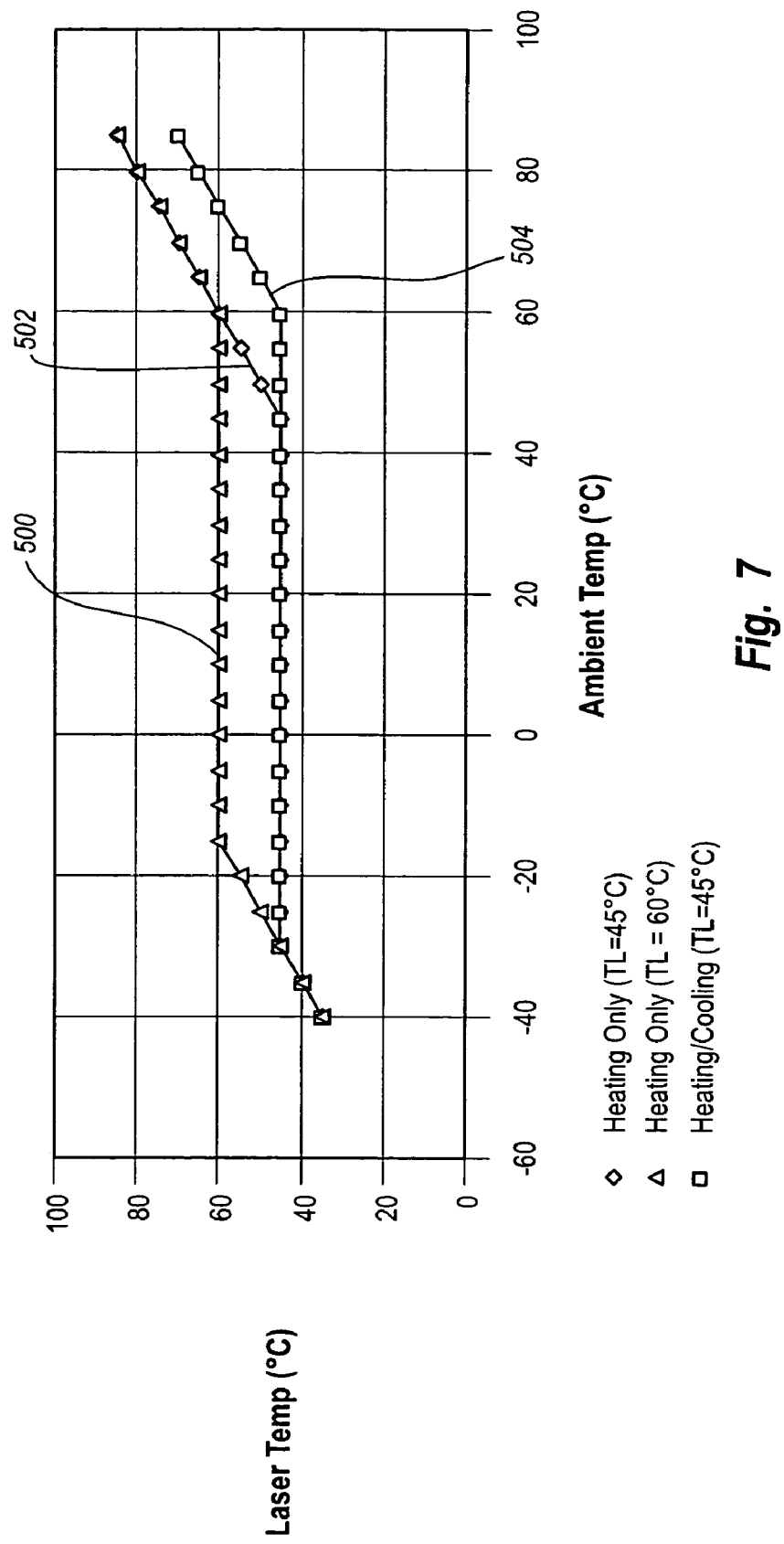
FIG. 7 illustrates several plots of laser diode temperatures shifting with ambient temperatures changes according to embodiments of the invention.

Referring now to FIG. 7, three additional examples of ambient temperature versus laser temperature are presented for other heating and cooling configurations. Particularly, plot 500 depicts a heating only embodiment where the laser temperature is locked to 60° C. in a heating only implementation. As previously mentioned, because this is a heating only embodiment, either a TEC or a resistive heater can be used. In plot 500, as well as in each of plots 502 and 504 discussed below, the maximum heating that can be provided to the laser by the TEC or resistive heater is 75° C. Because the temperature lock is 60° C., the device loses temperature lock below −15° C. ambient temperature, as indicated by the slope of line 500 to the left of 15° C. Still, at an ambient temperature of −60° C., the laser is at 35° C. As a result, the reduced temperature shift reduces the wavelength shift. Also, above 60° C. ambient temperature the laser temperature rises in step with the rising ambient temperature because no cooling is enabled. This is depicted by the upward slope of line 500 to the right of 60° C. ambient temperature.

Similarly, plot 502 depicts another heating only embodiment where the temperature lock is set to 45° C. In this case there is less of a temperature shift (and hence less of a wavelength shift) at the cold end of the ambient temperature range because it does not lose lock until the ambient temperature falls below −30° C. At the high end of the ambient temperature range, however, the device loses lock at 45° C. The laser temperature rises in step with the rising ambient temperature because no cooling is enabled. There is therefore a larger temperature and wavelength shift at high temperatures.

Plot 504, in turn, depicts an embodiment where both heating and cooling are enabled and the temperature is locked to 45° C. In this embodiment the maximum cooling that is enabled by the TEC is 15° C. Thus, the device loses lock at the cold end at −30° C. but at the hot end at only 60° C. (45° C. plus 15° of cooling). It can therefore be readily seen how enabling heating and cooling in a device maximizes the range at which a temperature lock can be maintained.

In various implementations of the invention, heating a laser to a set temperature will not be enough to ensure the accurate operation of the transmitter over a wide temperature range. This is because as laser temperature drifts up, not only do most conventional CWDM distributed feedback lasers have performance and/or reliability issues when operated for extended periods above 50° C., the slope efficiency drops and the extinction ratio correspondingly goes down.

In general, optical transmitters are configured to transmit at various power levels to enable transmission of binary data. More particularly, a relatively higher optical power transmission level P1 represents a binary 1, while a relatively lower optical power transmission level P0 represents a binary 0. Thus, optical transmission of binary data is achieved by modulating the output power of the optical transmitter. Such optical power transmission levels have certain implications concerning the performance of the optical transmitter.

For example, optical transmitters typically have a characteristic "extinction ratio," defined as P1/P0 (for power expressed in dBm). An ideal optical transmitter would have a P0 of 0, and the optimal extinction ratio would thus be infinite. In practice however, the optical transmitter must be biased such that P0 is near the laser threshold, so that P0 is, necessarily, somewhat greater than 0. This means that at least some optical power is transmitted at P0 and the actual extinction ratio is not infinite.

The particular value of the extinction ratio, as well as fluctuations in the extinction ratio, are related to the bit error rate ("BER") associated with the transmitted data stream. In general, the BER is derived from a count of the number of data errors that occurs within a predefined bit sequence. While an ideal BER would be zero, this result is generally not achievable in practice and so some BER must be accepted as a matter of course. In any case, maintenance of the BER at an acceptable level is important since a relatively constant BER lends a degree of predictability to the performance of the optical system, and also contributes to system reliability.

Not only are relatively low extinction ratios problematic, but high extinction ration, or extinction ratio fluctuation, is cause for concern as well. In particular, it is desirable to keep the extinction ratio constant at the factory-calibrated setting as much as possible. Particularly, a reduction in extinction ratio can cause issues related to signal-to-noise ration while an increase in extinction ratio can have even more deleterious affects, where transmission performance can be severely degraded at high extinction ratios.

In particular, it is necessary to correct for undesirable extinction ratio changes as ambient temperatures change. Extinction ratio correction is needed based on temperature error, or how far off from the calibrated temperature the laser is actually running, not absolute temperature. Since the calibrated temperatures can vary in some cases, it is important to base this correction on temperature error, not measured temperatures. To make extinction ration corrections, various embodiments of the invention incorporate firmware having a look up table that sets the AC swing, which drives the AC current for the laser. When the laser temperature rises above or below the set point, the AC swing is increased or decreased as directed by the look up table to keep the extinction ratio constant. In one embodiment, the look up table will conceptually have columns such as temperature error, laser bias current, and AC modulation lined up with corresponding laser temperature rows.

Figure 1:
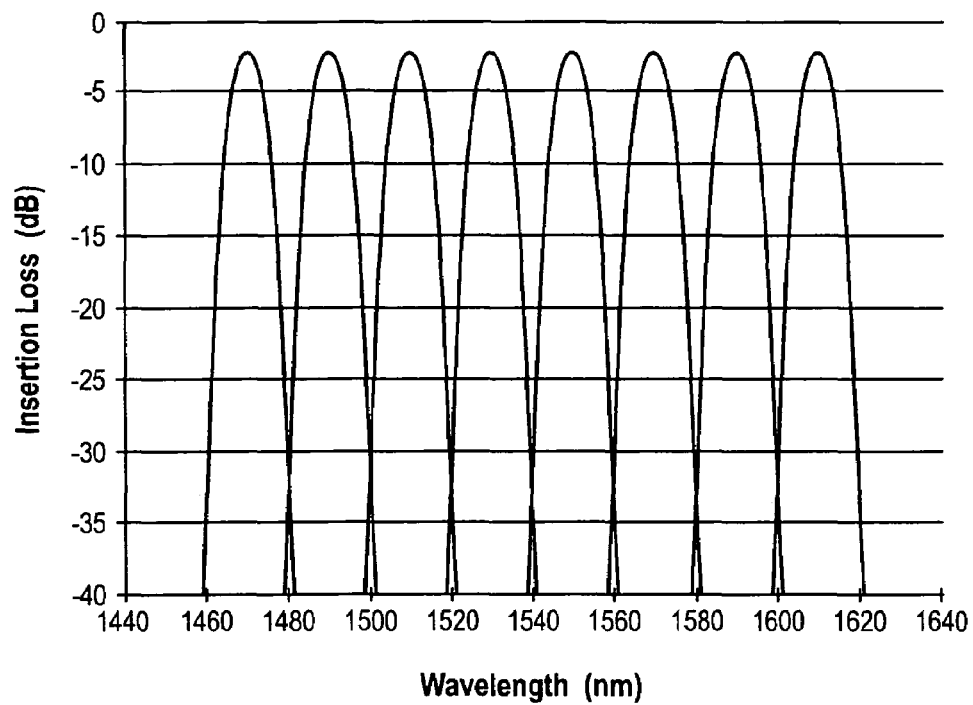
FIG. 1 illustrates eight wavelength channels typically implemented in a CWDM system.
Figure 2:
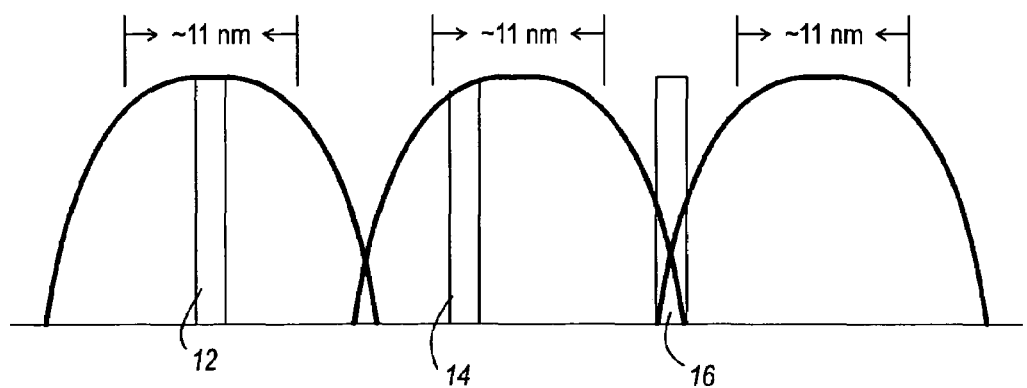
FIG. 2 illustrates greater details regarding several wavelength channels typically implemented in a CWDM system.

Referring again to FIGS. 1 and 2, current CWDM standards use approximately 11 nm passbands with passive passband filters creating steep shoulders on the edges of each passband. It is therefore necessary to keep the emitted light from a laser within the designated 11 nm passband. Embodiments of the invention ensure, by temperature locking a laser, as the ambient temperature shifts over a wide range, the wavelength of the emitted light does not shift outside its designated passband.

The preferred locking temperature is selected such that the loss of lock is minimized and balanced. For example, if the operational ambient temperature range is from −40° C. to 85° C. and the TEC can provide 20° C. of cooling and 65° C. of heating, then the optimum laser set temperature would be the one that balances the loss of lock at each of the high and low ends, or approximately 45° C. In other words, this device would lose lock for 20 degrees at the low end and 20 degrees at the high end. This is method calculation is true for a heating-only designs as well, except in this case the maximum cooling is zero degrees.

Alternatively, in the event that extreme cold temperatures do not need to be accounted for, higher temperatures can be selected as the set point to avoid expending excess energy on cooling. For example, 50° C. may be selected as a set point as it is the maximum operating temperature at which many conventional transceiver components currently operate. However, in the event that transceiver components that can withstand higher temperatures are used, a high laser temperature such as 55° C., 60° C., 65° C., 70° C., 75° C., 80° C. or 85° C. may be used as the set point.

One example method of calibrating a transmitter according to embodiments of the invention includes first directing a computer or other device in communication with transceiver 100 to set a target wavelength within a desired CWDM channel and commanding the microprocessor 130 to set the set point temperature of the laser diode in the TOSA 114 (via a TEC Command signal).

Additionally, the computer in communication with the microprocessor 130 may also set the $I_{laser\ bias}$ and the AC modulation for the laser operation to default values. These values can later be changed by referencing a look up table or other method as necessary if the operating temperature of the laser exceeds or falls below the set temperature.

Since the wavelength produced by a transceiver at a specified laser diode temperature and current density differs from one laser diode to another, the transceiver 100 may be initially calibrated before being installed in an optical network, as indicated by block 306. The calibration includes monitoring the wavelength of optical signals produced by the laser diode while varying its temperature and other operating conditions and then storing calibration information in the memory of the microprocessor 130. It also includes receiving analog signals from sensors in the optoelectronic device and converting the analog signals into digital values, which are also stored in the memory. Using this data, the device generates control signals based on the digital values in the microprocessor to control the temperature of the laser diode to maintain the desired emitted wavelength.

Figure 8:
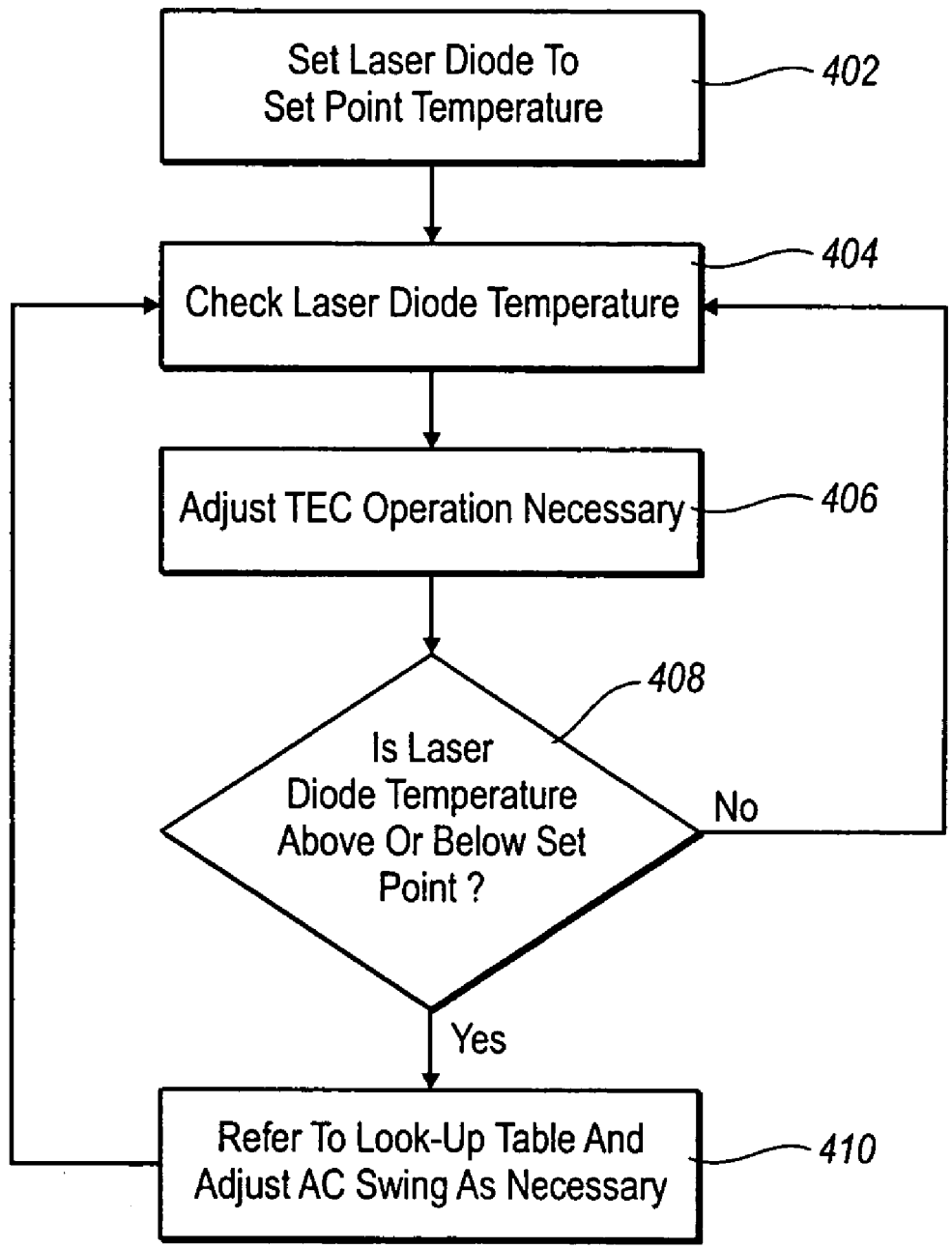
FIG. 8 illustrates a method of operating an optoelectronic device over a range of laser diode temperatures according to another embodiment of the invention.

With reference now to FIG. 8, another example method of operating a CWDM transmitter is depicted in block form. Initially, a computer or other device commands the microprocessor 130 to set the set point temperature of the laser diode in the TOSA 114 (via a TEC Command signal), as indicated by block 402.

The operating temperature of the laser diode is then continuously or repeatedly determined, for example by reference to one or more of temperature sensors 204, 208, and 210, or by using other methods known in the art to determine temperature, as indicated by block 404. The microprocessor 130, for example, then continuously reviews the laser diode temperature to see if it is above or below the set point temperature. If the laser diode temperature is above or below the set point temperature, then the TEC's (or other temperature controller) operation is adjusted as necessary, as indicated by block 406, and the temperature monitoring continues. If the laser diode temperature is above the set point temperature the TEC operates in cooling mode. If the laser diode temperature is below the set point the temperature the TEC operates in heating mode.

Due to the standards applicable to transceivers, however, there may not be enough power available to heat or cool the laser diode to the set point over the entire operational ambient temperature range of the transceiver. Accordingly, the microprocessor or other device monitors whether the power consumption is maximized before sufficient heating or cooling has occurred to return the laser diode temperature to the set point, as indicated by block 408. If the power consumption is maximized, then the laser diode will operate at above or below the set point and wavelength drift will occur. To avoid extinction ratio problems, the microprocessor or other device refers to the look up table in the TOSA firmware, for example, and the AC swing is adjusted as necessary to achieve the operational target values for laser power and extinction ratio, as indicated by block 410.

In some embodiments, a transceiver controller (not illustrated) is used to perform some of the functions otherwise performed by the microprocessor 130. For example, a transceiver controller may be used to look up values in tables and output these values through one or more digital to analog converters. Accordingly, the lookup table (or portions of the lookup table) may also be accessible to or stored by the transceiver controller so that it may output some control signals while the microprocessor 130 outputs other control signals.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can be embodied in transceiver firmware and/or include RAM, ROM, EEPROM, or any other medium which can be used to carry or store desired program code means in the form of computer-executable instructions or data structures and which can be accessed by microprocessor 130 or a general purpose or special purpose computer. Computer-executable instructions include, for example, instructions and data which cause microprocessor 130, a general purpose computer, special purpose computer, or special purpose processing device to perform a certain function or group of functions. Although not required, the invention may be described or claimed in the general context of such computer-executable instructions, such as program modules, being executed by computers. The particular sequence of such executable instructions or associated data structures represents examples of corresponding acts for implementing the functions described in such acts. Accordingly, the methods of the invention disclosed hereinabove can be configured to be operated by a computing device as computer-executable instructions.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   heating a laser diode in an optoelectronic assembly to a set point temperature that is above the typical ambient temperature of the optoelectronic assembly;
   operating the laser diode to emit light;
   heating or cooling the laser diode to keep the laser within a selected range around the set point temperature; and
   upon identifying that the temperature of the laser diode is above the set point, adjusting the AC swing driving the laser diode to maintain the extinction ratio of an optical signal emitted by the laser diode above a specified lower limit.

2. The method of claim 1, further comprising monitoring the laser diode temperature by a device selected from the group consisting of a temperature sensor in communication with the laser diode; a temperature sensor that is located within the optoelectronic assembly; and a temperature sensor that is located external to the optoelectronic assembly.

3. A method as in claim 1, wherein the act of heating the laser diode is performed by a thermoelectric cooler.

4. A method as in claim 1, wherein the AC swing is adjusted by referencing a look up table that indexes AC swing based on laser diode temperature.

5. A method as in claim 1, wherein the set point temperature comprises at least about 50° C.

6. An optoelectronic device, comprising:
   an optoelectronic assembly that includes a laser diode for emitting light;
   a laser driver for controlling the operation of the laser diode;
   a temperature controller coupled to the laser diode for controlling the temperature of the laser diode;
   at least one temperature sensor for detecting a temperature associated with the laser diode;
   memory configured to store a look up chart for controlling the AC swing of the laser diode based upon the detected laser diode temperature; and
   one or more control apparatuses for generating: a command signal to the temperature controller for controlling the operation of the temperature controller such that the temperature controller maintains the laser diode temperature within a range near a set point temperature; and a command signal to the laser driver for controlling the AC swing of the laser diode based upon the detected laser diode temperature.

7. The optoelectronic device of claim 6, wherein:
   the at least one temperature sensor includes a laser temperature sensor for monitoring a temperature from within the optoelectronic assembly and an external temperature sensor for monitoring an ambient temperature external to the optoelectronic assembly; and
   the microprocessor is configured to generate the command signal to the temperature controller as a function of both the temperature within the optoelectronic assembly and the monitored ambient temperature.

8. The optoelectronic device of claim 6, wherein the temperature controller comprises a thermoelectric cooler.

9. The optoelectronic device of claim 6, wherein said optoelectronic device comprises a Coarse Wavelength Division Multiplexing (CWDM) module, wherein the CWDM module is configured to operate from a first temperature to a second temperature, wherein the first temperature and the second temperature are separated by a temperature range such that operating a laser diode operating over the entirety of the temperature range would experience a wavelength shift that is larger than 8 nm.

* * * * *

UNITED STATES PATENT AND TRADEMARK OFFICE
CERTIFICATE OF CORRECTION

| | | |
|---|---|---|
| PATENT NO. | : 7,369,587 B2 | Page 1 of 1 |
| APPLICATION NO. | : 11/020052 | |
| DATED | : May 6, 2008 | |
| INVENTOR(S) | : Stewart et al. | |

It is certified that error appears in the above-identified patent and that said Letters Patent is hereby corrected as shown below:

<u>Title Page; item (73);</u>
Please insert --(Finisar Corporation)--

<u>Col. 1</u>
Line 23 change "a equipment" to --equipment--

<u>Col. 7</u>
Line 62 change "106" to --200--

<u>Col.9</u>
Line 22 change "a" to --to a--

<u>Col. 12</u>
Line 16 change "is method" to --method for--
Line 42 delete ", as indicated by block 306"

<u>Col. 14</u>
Line 16 change "of" to --of:--

Signed and Sealed this

Twenty-eighth Day of September, 2010

David J. Kappos
*Director of the United States Patent and Trademark Office*